United States Patent
Quan et al.

(10) Patent No.: US 8,622,646 B2
(45) Date of Patent: Jan. 7, 2014

(54) ELECTRONIC DEVICE WITH SLOT COVER EJECTION MECHANISM

(75) Inventors: Tong-You Quan, Shenzhen (CN); Qing Dai, Shenzhen (CN); Kun-Chih Hsieh, New Taipei (TW); Chia-Min Wang, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 160 days.

(21) Appl. No.: 13/249,257

(22) Filed: Sep. 30, 2011

(65) Prior Publication Data
US 2013/0045045 A1 Feb. 21, 2013

(30) Foreign Application Priority Data
Aug. 19, 2011 (CN) .......................... 2011 1 0239669

(51) Int. Cl.
*H05K 7/00* (2006.01)

(52) U.S. Cl.
USPC ........................ 403/325; 403/327; 361/679.39

(58) Field of Classification Search
USPC ............. 403/10, 322.1, 322.3, 325, 326, 327, 403/328, 330; 361/679.31, 679.32, 679.38, 361/679.39
See application file for complete search history.

(56) References Cited

U.S. PATENT DOCUMENTS

| 4,752,150 | A | * | 6/1988 | Salice | 403/330 |
| 5,000,696 | A | * | 3/1991 | Matsuoka et al. | 439/331 |
| 5,398,162 | A | * | 3/1995 | Bice | 403/322.3 |
| 6,192,557 | B1 | * | 2/2001 | Fujisawa | 24/457 |
| 6,445,572 | B1 | * | 9/2002 | Chou | 361/679.4 |
| 7,134,802 | B2 | * | 11/2006 | Doerr et al. | 403/322.1 |
| 2008/0253078 | A1 | * | 10/2008 | Neukam | 361/685 |
| 2009/0263187 | A1 | * | 10/2009 | Lee | 403/330 |
| 2010/0208423 | A1 | * | 8/2010 | Lai | 361/679.38 |
| 2011/0299237 | A1 | * | 12/2011 | Liang | 361/679.38 |
| 2012/0140398 | A1 | * | 6/2012 | Fu et al. | 361/679.31 |

* cited by examiner

*Primary Examiner* — Michael P Ferguson
(74) *Attorney, Agent, or Firm* — Altis Law Group, Inc.

(57) ABSTRACT

An electronic device includes a frame defining a slot and a first through hole, a slot cover moveably received in the slot, a latching member rotateably connected to the frame, and a torsion spring. The latching member includes a first arm and a second arm protruding therefrom and extending in opposite directions. When the latching member is at a locking position, the first arm faces the first through hole, and the second arm engages an elastic hook to retain the cover in the slot. The spring includes a first arm fixed to the first arm and a second arm fixed to the frame. The latching member is driven to rotate when the first arm is pushed by an elongated object passing through the first through hole, causing the second arm push the elastic hook to be deformed, thereby allowing the second arm to disengage from the elastic hook.

3 Claims, 5 Drawing Sheets

ELECTRONIC DEVICE WITH SLOT COVER EJECTION MECHANISM

BACKGROUND

1. Technical Field

The present disclosure relates to electronic devices, and particularly, to an electronic device with a slot cover ejection mechanism.

2. Description of the Related Art

Electronic devices such as cell phones usually include an electronic card, such as subscriber identity module (SIM) card. Commonly, the SIM card is positioned in the electronic device. A user has to open a back cover of the electronic device when attempting to take out the SIM card, which is inconvenient.

Therefore, there is room for improvement within the art.

BRIEF DESCRIPTION OF THE DRAWINGS

The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
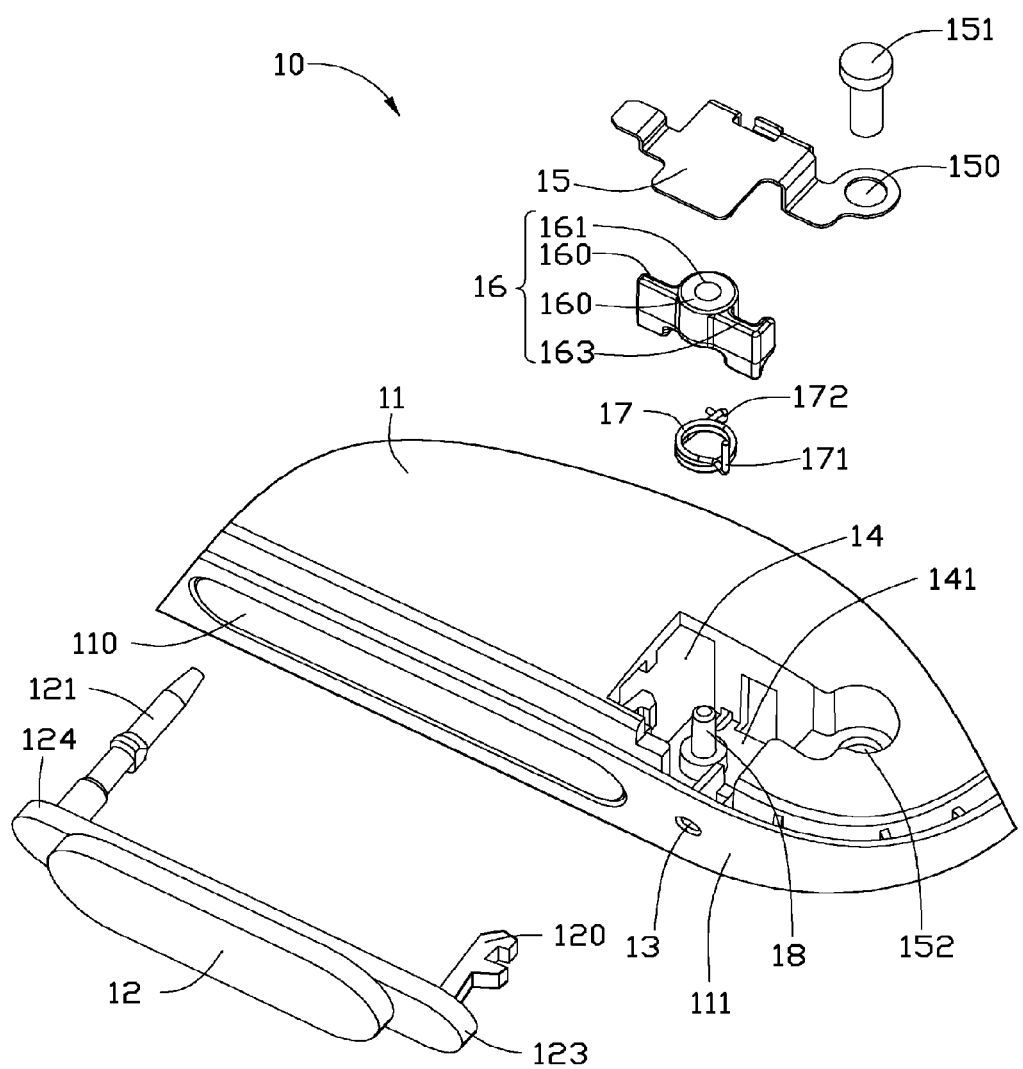
FIG. 1 is an isometric exploded view of an electronic device in accordance with an exemplary embodiment.
Figure 2:
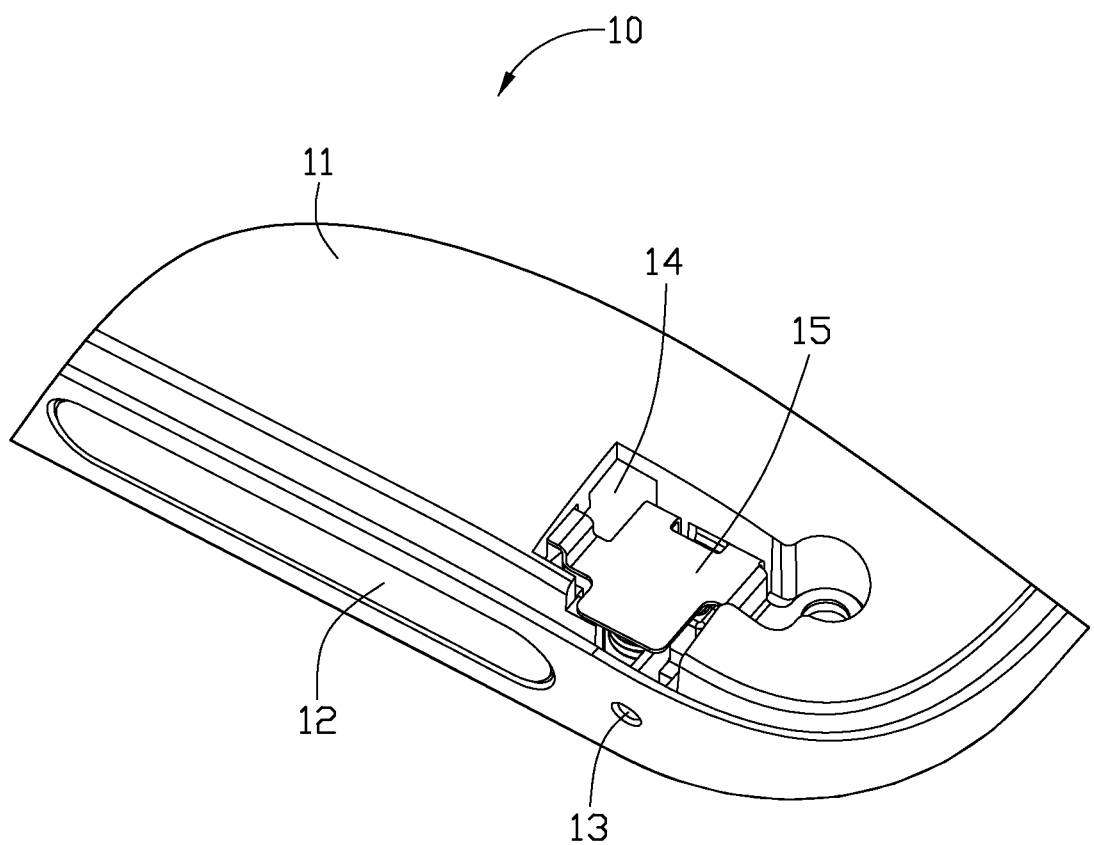
FIG. 2 is an assembled view of the electronic device in FIG. 1.

Referring to FIGS. 1 and 2, an electronic device 10 includes a frame 11 and a slot cover 12. The frame 11 is mounted between an upper housing (not shown) and a lower housing (not shown) of the electronic device 10, and used to support elements (not shown) of the electronic device 10. The frame 11 defines a sidewall 113, and the sidewall 113 defines a first through hole 13 and a slot 110. The slot 110 can receive the cover 12. An electronic card connector (not shown) is arranged within the frame 11 and electrically connected to a circuit board (not shown) with an open end aligned with the slot 110, and is used to receive an electronic card, such as a flash memory card or a subscriber identity module (SIM) card. The cover 12 is configured to cover the slot 110. The connector includes a conventional ejection mechanism (not shown) configured to push an electronic card out when the electronic card is depressed.

The electronic device 10 further includes a lid 15, a rotatable latching member 16, and a torsion spring 17. The frame 11 further defines an interior 112 extending through the sidewall 113 and a cavity 14 within the interior 112 of the frame 11 for receiving the lid 15, the latching member 16, and the torsion spring 17. The cavity 14 and the slot 110 communicate with each other, the cavity 14 and the first through hole 13 also communicate with each other. A second through hole 150 is defined in the lid 15. A screw 151 passes through the second through hole 150 and is screwed into a threaded hole 152 of the frame 11, thereby fixing the lid elastic piece 15 to the frame 11. The latching member 16 includes a main body 160 defining a third through hole 161. A protruding pin 18 of the frame 11 which protrudes from the bottom 141 of the cavity 14 is received in the third through hole 161. The torsion spring 17 which is connected between the bottom of the cavity 14 and the latching member 16 is received in the third through hole 161 and coiled around the protruding pin 18.

Figure 3:
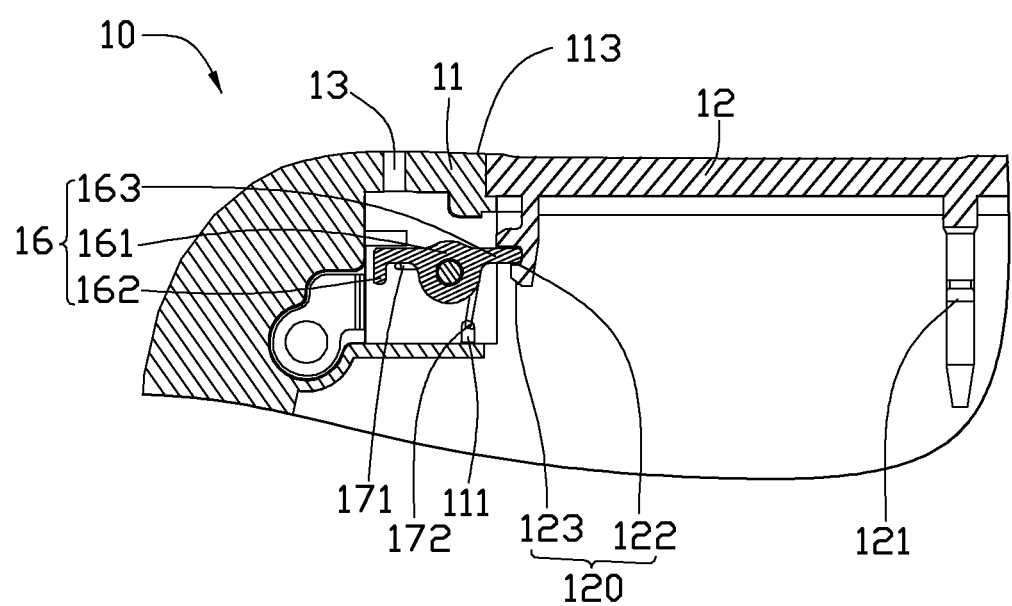
FIG. 3 is a cross-sectional view of the electronic device in FIG. 1 when a cover is retained in an opening.
Figure 4:
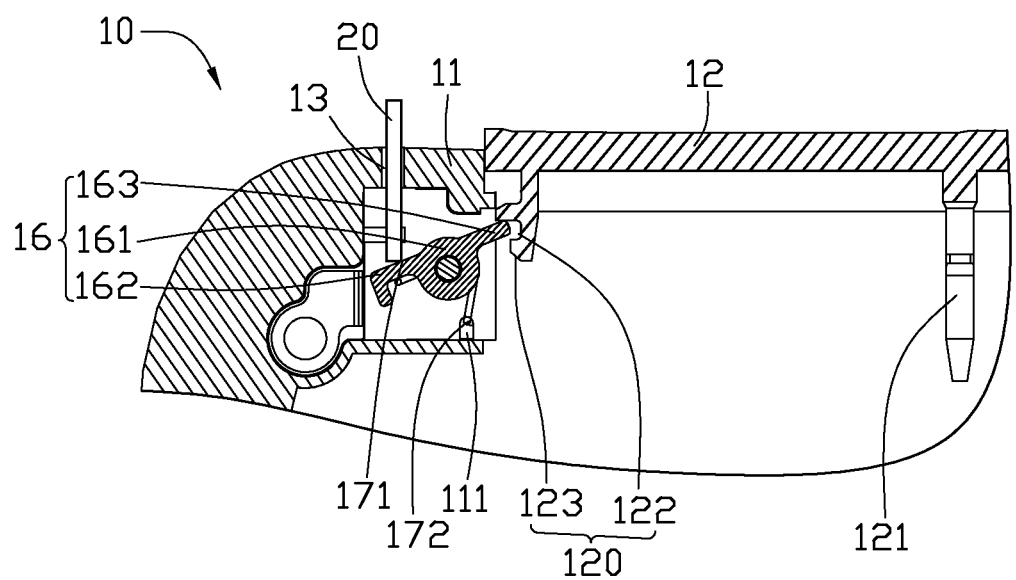
FIG. 4 is a cross-sectional view of the electronic device in FIG. 1 when the cover is moving out of the opening.
Figure 5:
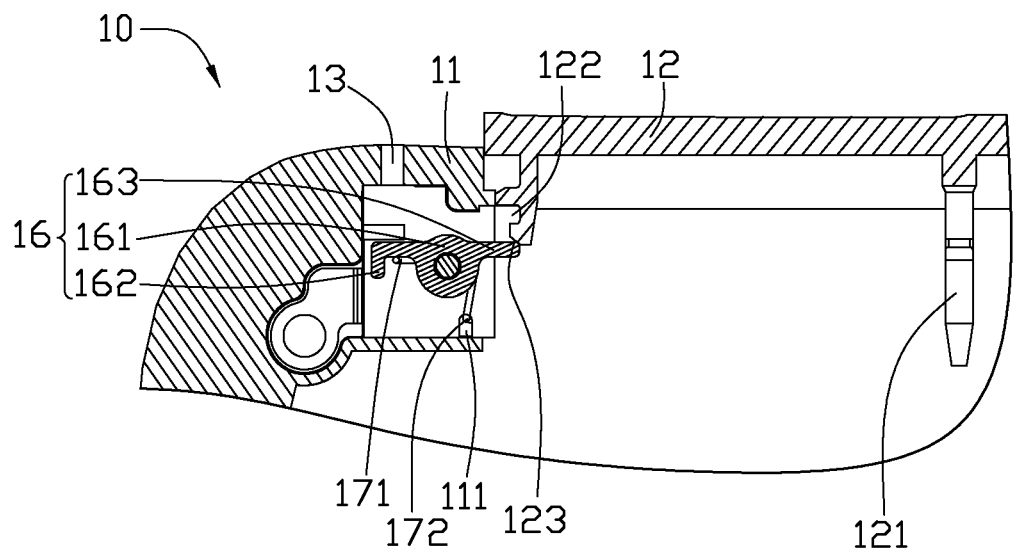
FIG. 5 is a cross-sectional view of the electronic device in FIG. 1 when the cover is pushed into the opening.

Referring to FIG. 3, the latching member 16 further includes a first arm 162 and a second arm 163 protruding from opposite sides of the main body 160. The torsion spring 17 includes a first arm 171 and a second arm 172. The first arm 171 is fixed to the first arm 162, and the end of the second arm 172 is received in a through hole 111 defined in the frame 11. The torsion spring 17 can retain the latching member 16 in the normal position.

The cover 12 includes a cover body 125, an elastic hook 120 and a positioning post 121 both protruding from the cover body 125 and extending towards a same longitudinally direction. The hook 120 and the positioning post 121 are located at two opposite ends 123 and 124 of the cover 12, and the hook 120 is located at the end 123 which is closer to the first through hole 13 and which longitudinally extends through the slot 110 and radially outwardly extends towards the first through hole 13 to engage an interior surface 1131 of the sidewall 113, and the hook 120 and the positioning post 121 are received in the slot 110 when the slot cover 12 is received in the slot 110. The positioning post 121 is moveably received in the through hole of the frame 11. The first arm 162 faces the first through hole 13 and the second arm 163 engages the hook 120 when the slot cover 12 is received in the slot 110, thereby limiting the movement of the cover 12. In the embodiment, the hook 120 defines an indentation 122 to receive a free end of the second arm 163 and thus come into engagement with the second arm 163.

When needed, a thin pin 20 can be inserted into the first through hole 13 to push the first arm 162. The latching member 16 is then urged to rotate around the protruding pin 18. The second arm 162 moves and pushes the elastic hook 120, causing the elastic hook 120 to be elastically deformed radially inwardly away from the first through hole 13 until the elastic hook 120 disengages from the second arm 163, which frees the cover 12 from the limitation of the second arm 163, and the elastic hook 120 to disengage the interior surface 1131 of the sidewall 113 and to be longitudinally removed from the slot 110 in an unlatched condition to allow the cover 12 to move out of the slot 110.

In the embodiment, the positioning post 121 is made of flexible material. When moving out of the slot 110, the cover 12 can be turned over to show the electronic card positioned in the connector. In an alternative embodiment, the positioning post 121 may be made of hard material. When freeing from the limitation of the second arm 163, the cover 12 can be pulled out of the opening 111 to disengage from the frame 11, allowing the electronic card in the connector to be exposed.

When the thin pin 20 pushes the first arm 162, the first arm 171 fixed to the first arm 162 is driven to move in union with the first arm 162. The spring 17 is thus deformed. When the hook 120 disengages from the second arm 163, the rotatable latching member 16 is urged to return to the normal position by the restoring force of the spring 17.

When the electronic card has been removed or inserted into the connector again, a user can push the cover 12 into the slot 110. The hook 120 then pushes the second arm 163 to move. In the embodiment, the hook 120 includes an inclined plane 123 at the free end of the hook 120. The inclined plane 123 resists against the free end of the second arm 162 when pushing the cover 12, causing the hook 120 to be deflected. When the hook 120 deflects to the extent that the free end of the second arm 163 moves away from the engagement with inclined plane 123, the second arm 163 is driven to move back by the spring 17 until contacting the sidewall of the indentation 122. The free end of the second arm 162 is received in the indentation 122 when the hook 120 rebounds. Thus, the cover 12 can be retained in the slot 110.

It is understood that the present disclosure may be embodied in other forms without departing from the spirit thereof. Thus, the present examples and embodiments are to be considered in all respects as illustrative and not restrictive, and the disclosure is not to be limited to the details given herein.

What is claimed is:

1. An electronic device comprising:
a frame, wherein the frame comprises a sidewall, the sidewall defines a slot and a first through hole, and the frame further defines an interior extending through the sidewall, and a cavity within the interior of frame, and a protruding pin protruding from a bottom of the cavity, wherein the slot and the cavity communicate with each other, the cavity and the first through hole communicate with each other;
a slot cover moveably received in the slot, the slot cover comprising a cover body and an elastic hook which protrudes from one end of the cover body which is adjacent to the first through hole and which longitudinally extends through the slot and radially outwardly extends towards the first through hole to engage an interior surface of the sidewall when the slot cover is received in the slot in a latched condition;
a latching member, which is received in the cavity, comprising a main body defining a second through hole, a first arm and a second arm; the second through hole receiving the protruding pin therein and rotatable around the protruding pin, the first arm and the second arm both protruding from two opposite sides of the main body, the first arm facing the first through hole and the second arm engaging the elastic hook to retain engagement of the elastic hook with the interior surface of the sidewall to retain the cover in the slot when the slot cover is received in the slot in the latched condition; and
a torsion spring, which is coiled around the protruding pin, comprising a first arm and a second arm, the first arm of the torsion spring being fixed to the first arm of the latching member, and the second arm of the torsion spring being fixed to the frame;
wherein the latching member is driven to rotate around the protruding pin when the first arm of the latching member is pushed by an elongated object passing through the first through hole, causing the second arm of the latching member to push the elastic hook to be deformed radially inwardly away from the first through hole, thereby allowing the elastic hook to disengage from the second arm of the latching member, and the elastic hook to disengage the interior surface of the sidewall and to be longitudinally removed from the slot in an unlatched condition to allow the slot cover to disengage from the frame.

2. The electronic device as recited in claim 1, wherein the slot cover further comprises a positioning post, the elastic hook and the positioning post protrude from the cover body and extend towards a same longitudinally direction, the elastic hook and the positioning post located at two opposite ends of the cover, the frame defines a through hole for receiving the positioning post.

3. The electronic device as recited in claim 1, wherein the elastic hook defines an indentation to receive a distal end of the second arm of the latching member.

* * * * *